United States Patent [19]
Clark et al.

[11] 4,400,812
[45] Aug. 23, 1983

[54] LASER DRIVE CIRCUITS

[75] Inventors: L. Dale Clark; William J. Archambeault, both of Goleta, Calif.

[73] Assignee: Santa Barbara Research Center, Goleta, Calif.

[21] Appl. No.: 273,898

[22] Filed: Jun. 15, 1981

[51] Int. Cl.³ .............................................. H01S 3/13
[52] U.S. Cl. ..................................... 372/29; 372/38; 372/81; 307/270; 307/285
[58] Field of Search ............................ 372/38, 29, 81; 307/270, 285

[56] References Cited

U.S. PATENT DOCUMENTS 4,223,238  9/1980  Parkinson et al. ............... 307/285
4,347,445  8/1982  Baker ................................ 307/270

Primary Examiner—William L. Sikes
Assistant Examiner—Léon Scott, Jr.
Attorney, Agent, or Firm—K. W. Float; W. J. Bethurum; A. W. Karambelas

[57] ABSTRACT

Circuitry which is capable of supplying a short-pulse-width drive signal to a laser source, or the like. The circuitry comprises a plurality of VMOS transistors arranged to amplify both the voltage and current levels of an applied low-voltage, short-pulsewidth input signal, while maintaining the short pulsewidth thereof. Two embodiments are disclosed which employ either a plurality of parallel VMOS transistors in the output stage, or a signal VMOS output transistor, to drive the laser source. Pulsewidths of the drive signal are on the order of 20–40 nanoseconds with rise and decay times on the order of 2–7 nanoseconds. A first embodiment is capable of providing drive signals having peak power levels of about 90 watts utilizing an 80 volt power supply. A second embodiment is capable of providing drive signals having peak power levels on the order of 500 milliwatts. The second embodiment, however, has faster rise and decay times and operates at a pulse repetition frequency about 50 times faster than the first embodiment.

8 Claims, 8 Drawing Figures

89.54 WATTS

LASER DRIVE CIRCUITS

BACKGROUND OF THE INVENTION

The present invention relates to laser drive circuits and more particularly to laser drive circuits which incorporate vertical metal-on-silicon (VMOS) transistors therein.

High-power injection lasers, also known as junction-diode lasers, are customarily pulsed at a low duty factor, normally less than 1%, in order to avoid large internal power dissipation. The pulsewidths of such pulses are on the order of 10–200 nanoseconds, and have a large current magnitude, on the order of 20–50 amperes. The characteristics of the injection laser are such that it is most desirable to drive the laser with current pulses whose rise and decay times are very short. Various methods of generating such pulses have been devised, but each one has drawbacks in terms of its operating characteristics.

Electromechanical switches have been employed to pulse injection lasers, but such switches are unacceptable due to low speed, contact bounce, and shock immunity problems. A common-emitter bipolar junction transistor switch has also been employed. However, because of the high peak current and off-state collector-to-emitter voltages associated with this type of circuit, a power transistor is required to drive the laser. One typical common-emitter bipolar junction transistor is rated at 30 amperes, 100 volts and 150 watts, and can saturate to a $V_{CE(Sat)} = 1.7$ volts. However, this transistor has a current-gain cutoff ($f_t$) of only 30 MHz and a collector-to-base capacitance of about 600 pF. Therefore, a circuit employing this transistor would have a relatively low operating speed, since the circuitry driving the transistor would be severely stressed during operation. Also, both the turn-on and turn-off capabilities of this type of switching device are unacceptable, due to slow rise and decay times.

Four layer semiconductor switches have gained considerable acceptance for the laser-firing function. Unfortunately, such devices cannot be turned off except by causing the current flowing through them to become zero. This may be accomplished by employing a second switch in series to shut off the flow of charge, but this also reduces the operating speed of the device. Also, the charge storage element may be drained of energy, thereby stopping the flow of charge. The inability to adequately turn the device off on command as well as its relatively slow turn-on characteristic reduce the value of this type of switch for use in generating fast laser firing pulses.

A bipolar junction transistor used in a common-emitter switch configuration may be employed to turn on a current pulse capable of firing a high-power laser. The switch is operated at a collector voltage well above its rating, and a turn-on pulse applied to the base can cause an abrupt collapse of the collector-to-emitter path, commonly known as an avalanche condition, thus allowing the transistor to rapidly turn on current to the laser. A typical bipolar junction transistor avalanches at voltages between 200–300 volts. The turn-off of such a device is usually accomplished by exhausting the energy in a charge storage capacitor similar to the above-mentioned silicon-controlled-rectifier switch. Problems with both types of switches include that of temperature-compensation and thermal drift, as well as inability to turn the switch off on command.

Accordingly, it would be an improvement in the laser drive circuit art to have a circuit which may rapidly and accurately turn current on or off to a laser source in response to a low voltage command signal.

It would also be an improvement in the laser drive circuit art to have a circuit which pulses a laser source in response to low voltage command signals such as may be provided by conventional logic circuits.

SUMMARY OF THE INVENTION

In order to overcome the shortcomings of prior laser drive circuits, the present invention comprises circuitry for providing a short pulsewidth drive signal to a laser source, such as a laser diode, in response to a low voltage short-pulsewidth command signal. The circuitry includes a VMOS amplifier stage incorporating at least one VMOS transistor which amplifies the command signal to a predetermined voltage level. This amplified command signal is applied to a complementary driver stage which incorporates a plurality of VMOS transistors arranged in a push-pull manner. The driver stage provides a high current output signal in response to the applied amplified command signal. An output stage is coupled to the driver stage and the laser source. In a first embodiment, the output stage incorporates a plurality of VMOS transistors arranged in a parallel configuration which is driven by the high current output signal from the driver stage, and initiates a much higher current in the laser source. This drive signal has high power and a short pulsewidth which is controlled by the shape and duration of the command signal. The first embodiment may be used in situations where high-power, short duration pulses are required, such as in detection systems, and the like. In a second embodiment, a single VMOS transistor is utilized in the output stage. The second embodiment provides a moderately high power output pulse but operates at pulse repitition rates on the order of 50 times higher than the first embodiment. The second embodiment may be most readily employed in communications systems, and the like.

The circuitry of the present invention allows the drive signal (of moderate or high power) to be turned on and turned off rapidly in response to the low voltage command signal. The pulsewidth is generally on the order of 20–40 nanoseconds. The rise times and decay times of the drive signal are on the order of 20 nanoseconds for the first embodiment, which is a factor of 2–2.5 times faster than conventional laser drive circuits. The second embodiment has shown rise times of 2–7 nanoseconds, which is a factor of 3–4 times faster than conventional circuits. Also, since VMOS transistor circuitry is utilized, the drive circuit of the present invention is generally temperature insensitive over a wide range of temperatures. In addition, the drive circuit is responsive to low level logic signals as may be provided by TTL logic, or the like, as the command signal.

BRIEF DESCRIPTION OF THE DRAWING

The features and advantages of the present invention may be more readily understood with reference to the following detailed description taken in conjunction with the accompanying drawings, wherein like reference numerals designate like structural elements, and in which.

DETAILED DESCRIPTION OF THE INVENTION

Figure 1:
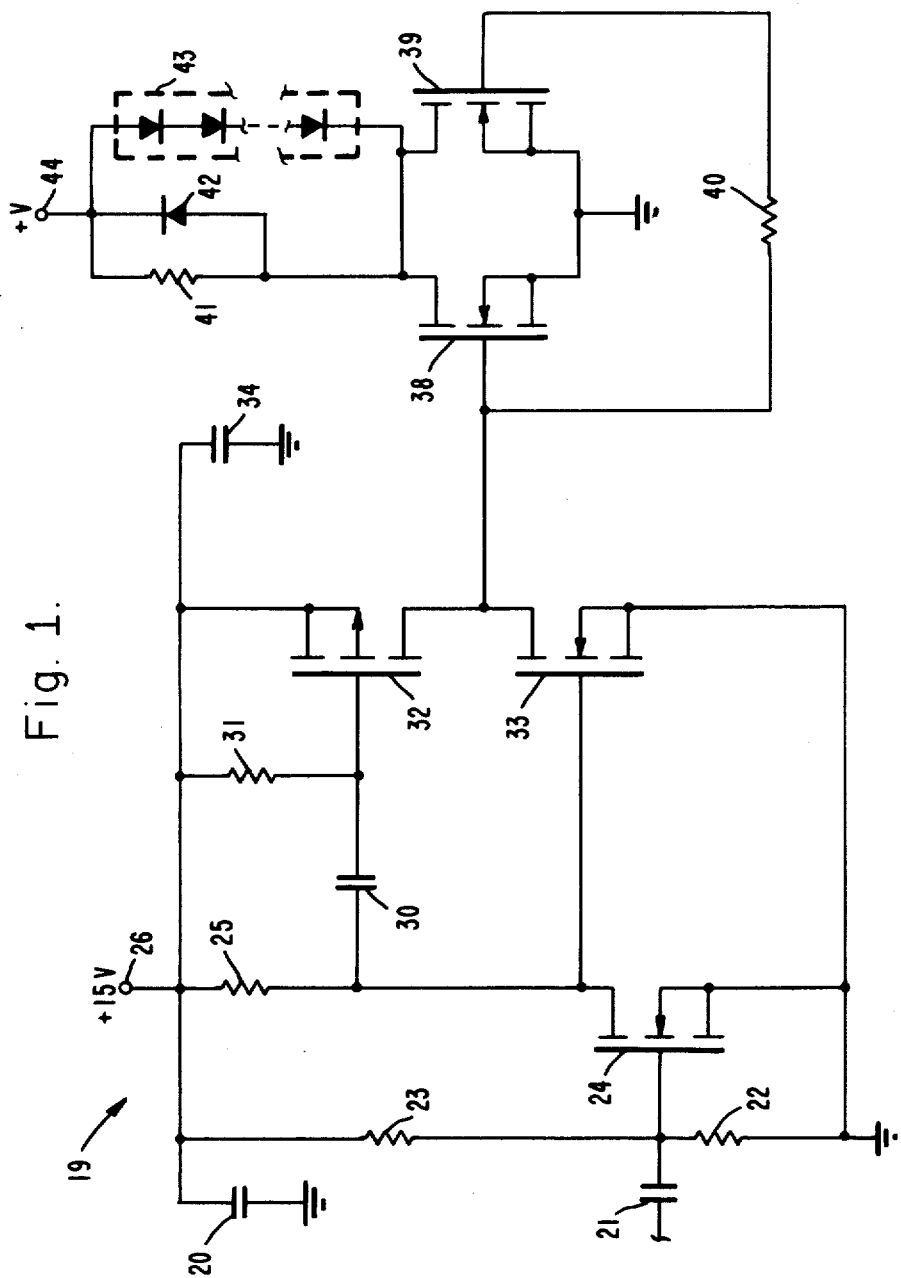
FIG. 1 is a schematic of one embodiment of a laser drive circuit in accordance with the present invention.

FIG. 1 shows one embodiment of a laser drive circuit 19 in accordance with the principles of the present invention. A command signal source (not shown), such as may provide TTL logic signals, or the like, provides command signals to the circuit 19 of the present invention. The circuit 19 includes an input capacitor 21 which is coupled to the gate electrode of a first VMOS transistor 24. The VMOS transistor 24 is commonly known in the art and is essentially an FET transistor with a modified gate electrode in the form of a V. VMOS transistors are readily available from manufacturers such as Supertex, Inc., Sunnyvale, CA., Siliconix, Inc., Sunnyvale, CA., and International Rectifier, El Segundo, CA. This type of transistor is generally utilized for high power and fast speed applications.

The gate of the first VMOS transistor 24 is coupled through a resistor 22 to ground, and through a resistor 23 to a 15 volt DC voltage source 26, which is bypassed by a capacitor 20 to ground. The drain electrode of the transistor 24 is coupled through a resistor 25 to the voltage source 26. The source electrode of transistor 24 is internally connected to the substrate thereof and is externally connected to ground. The aforementioned components from the amplifier stage of the laser drive circuit 19. Command signal inputs from the command signal source, which may be typical TTL logic signals on the order of 3.5 volts, are amplified by this arrangement to have a voltage level of approximately 15 volts.

The drain electrode of the transistor 24 is capacitively coupled through capacitor 30 to the gate of a second VMOS transistor 32 and directly coupled to the gate of a third VMOS transistor 33. VMOS transistors 32, 33 form a complementary common-source driver stage of the drive circuit 19. The VMOS transistors 32, 33 arranged in a push-pull manner, with transistor 32 being a p-channel device and transistor 33 being an n-channel device.

The 15 volt voltage source 26 is coupled through a resistor 31 to the gate electrode of transistor 32 and also coupled to the drain electrode of transistor 32 and through a capacitor 34 to ground. The source electrode of transistor 32 is internally connected to the substrate thereof. The drain electrode of transistor 32 is coupled to the drain electrode of transistor 33. The source electrode of transistor 33 is internally connected to the substrate thereof and is externally coupled to ground.

The driver stage of the present circuit 19, which comprises transistors 32, 33 provides a high-current output signal in response to the amplified command signals provided by the amplifier stage. The output from the driver stage has a high current capacity and a very short pulsewidth, on the order of 40 nanoseconds.

The output of the driver stage is applied to the gate electrode of a VMOS transistor 38, and through a resistor 40 to the gate electrode of a second VMOS transistor 39. The transistors 38, 39 form the output stage of the present circuit. The two transistors 38, 39 are connected in a parallel fashion, with the source electrodes of both transistors being internally connected to their respective substrates and externally connected to ground, and the drain electrodes being connected together. The drain electrodes are connected through a filter arrangement comprising resistor 41 and diode 42 to a second voltage source 44. In addition the drain electrodes are connected through a laser source 43, such as a plurality of serially coupled laser diodes, or the like, to the voltage source 44. The laser source 43 and the filter arrangement are connected in parallel.

One possible embodiment of the laser source 43 is a custom-made laser diode array manufactured by Laser Diode Labs, Inc., New Brunswick, New Jersey. However, a user may choose any source suitable to his needs. The voltage source 44 is shown as a positive voltage V. The actual voltage applied to the laser source 43 is dependent upon that source. For example, the voltage source 44 may be an 80 volt source when the laser source 43 comprises 9 laser diode junctions connected in series, as shown in FIG. 1.

The output stage of the present invention responds to the output signal from the drive stage and amplifies the voltage level to that of the voltage source 44. The effective on-state resistance of the parallel output transistors 38, 39 is low, on the order of 0.2 ohms. Therefore, the drive signals applied to the laser source 43 are both high voltage and high current, yielding a high power pulse. In addition, the pulsewidth of this drive signal is very short in duration, being on the order of 40 nanoseconds.

Appendix A presented hereinbelow provides a complete parts listing of the circuit described with reference to FIG. 1. It is provided for informational purposes only and should not be taken as limiting.

In operation, the laser drive circuit 19 receives TTL logic command signals from the command signal source and amplifies those signals to a predetermined level in the amplifier stage. For the particular embodiment herein disclosed that predetermined level is 15 volts. This amplified command signal is applied to the driver stage which amplifies the current of the amplified command signal to a level determined by the combined input capacitance of the output transistors 38, 39 and the rate of change of signal voltage with respect to time, as defined by the equation $I = C(dv/dt)$. The output of the driver stage is then applied to the output stage which amplifies the voltage, and whose low on-state resistance permits the amplified voltage to cause large currents, on the order of 30 amps, to exist in the laser diode source 43. Due to the nature of the circuit, and in particular the utilization of VMOS transistors, the output drive signal applied to the laser source 43 may have a very short pulsewidth and the turning on and turning off of this drive signal may be accurately controlled by the command signals applied to the laser drive circuit.

Referring to FIG. 2, several graphs are presented which show the performance characteristics of the circuit of FIG. 1. FIG. 2a shows the output power pulse of the laser source 43. The pulsewidth of this pulse is about 40 nanoseconds, and the peak output power is about 90 watts. This output curve was obtained utilizing the drive circuit 19 of FIG. 1, and to which a 15 volt, 3 milliamp voltage supply was applied at the voltage source 26, and an 80.7 volt, 14 milliamp average, 30 amp peak, voltage supply was applied at the the voltage source 44. FIG. 2b shows the drain-to-source voltage of the output drive stage VMOS transistors 38, 39. This voltage signal has a pulsewidth of about 40 nanoseconds, resulting in the laser output signal of FIG. 2a. Both FIGS. 2a and 2b are on the same time base.

Figure 2A:
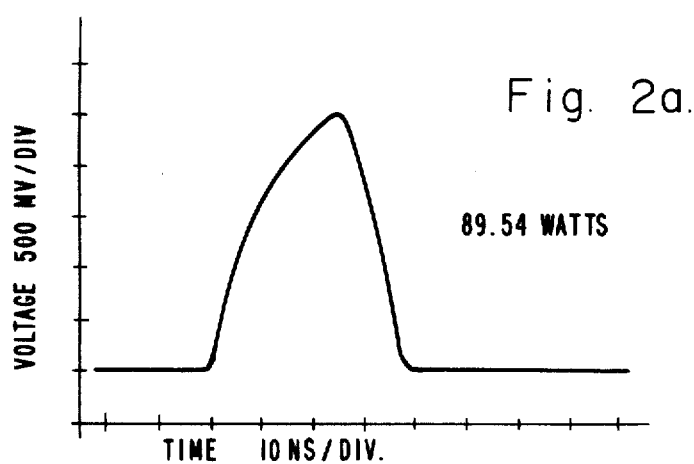
FIG. 2 illustrates typical test data showing the shape and pulsewidths of signals associated with the circuit of FIG. 1.
Figure 2B:
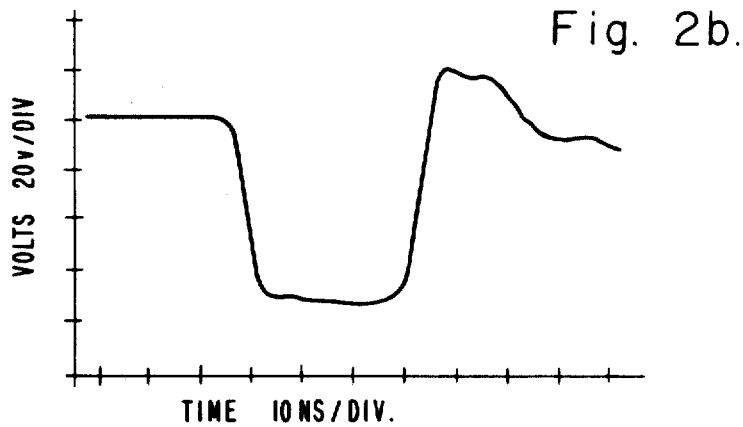
Figure 2C:
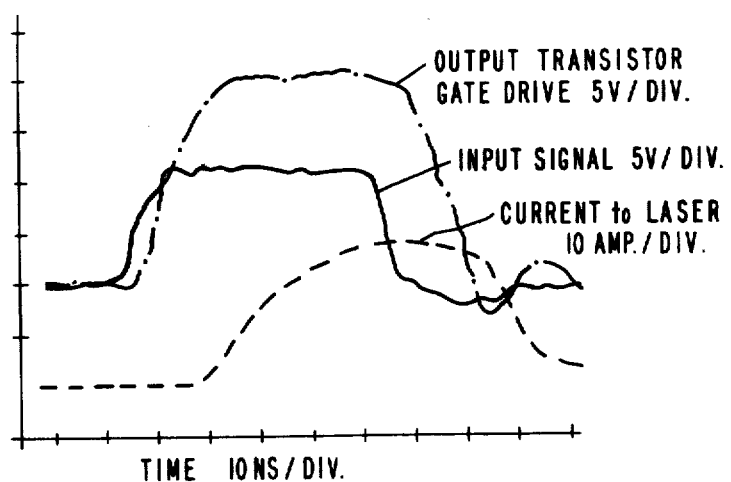
Figure 2D:
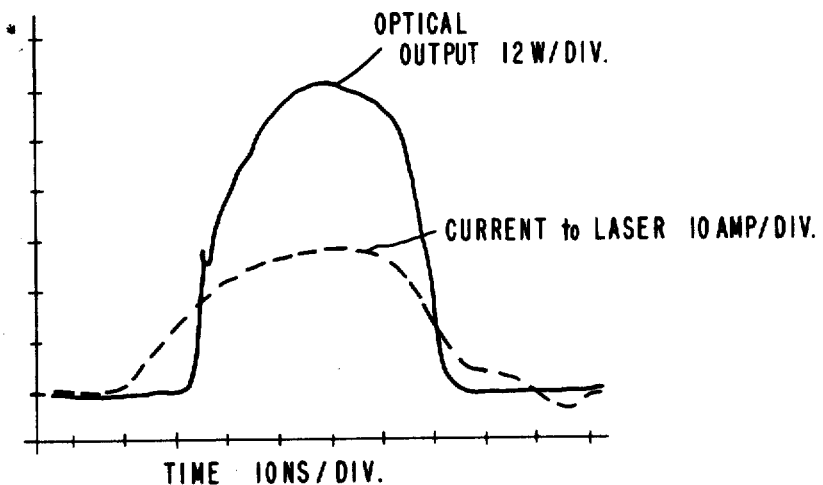

FIG. 2c shows three plots representing the command signal (solid curve), the gate drive signal on the output transistors 38, 39 (elongated dash curve) and the current in the laser source 43 (dashed curve). FIG. 2d shows a corresponding graph which shows the output power from the laser source 43 (solid curve) along with the above-mentioned laser diode current (dashed curve). FIGS. 2c and 2d show the timing relationships between the various signals included on those graphs.

Figure 3:
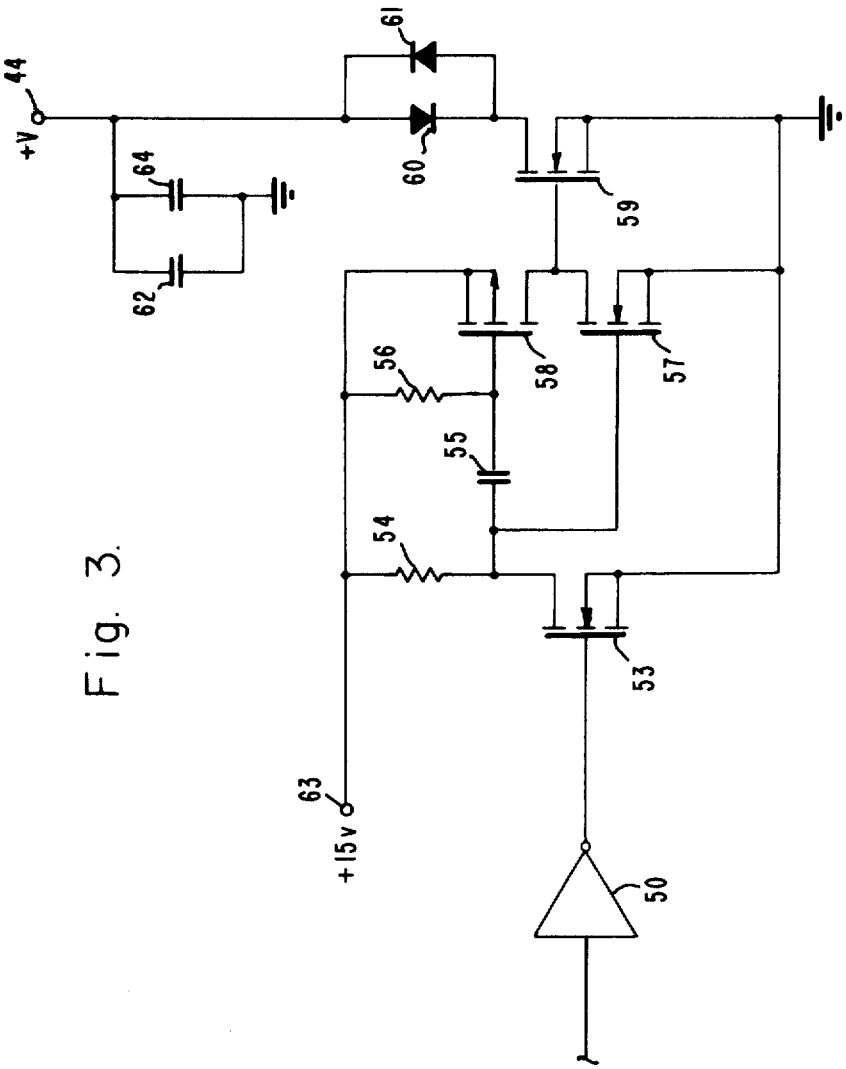
FIG. 3 is a schematic of a second embodiment of a laser drive circuit in accordance with the present invention.

Referring to FIG. 3, there is shown a second embodiment of a laser drive circuit in accordance with the present invention. In this embodiment, command signals are applied to an input of an inverting amplifier (NOR gate) 50 whose output is coupled to the gate electrode of VMOS transistor 53. The drain electrode of the transistor 53 is coupled to the voltage source 63 through a resistor 54, and is capacitively coupled through a capacitor 55 to the gate of a second VMOS transistor 58. The drain electrode is also coupled to the gate electrode of a third VMOS transistor 57. The source electrode of transistor 53 is internally connected to the substrate thereof and is externally connected to ground. The gate electrode of transistor 58 is coupled through a resistor 56 to the voltage source 63. The voltage source 63 is coupled to the source electrode of transistor 58. The source electrode of transistor 58 is internally connected to the substrate thereof. The source electrode of transistor 57 is internally connected to the substrate thereof and also coupled to ground.

The drain electrodes of transistors 57, 58 are coupled together and are connected to the gate electrode of a fourth VMOS transistor 59. The source electrode of transistor 59 is internally connected to the substrate thereof and is coupled to ground. The drain electrode of transistor 59 is coupled through a laser source 60 to the voltage source 44. A protection diode 61 is coupled across the laser source 60, while two bypass capacitors 62, 64 are connected from a point between the voltage source 44 and laser source 60 to ground.

As in the embodiment of FIG. 1, the drive circuit of FIG. 3 comprises an input stage, a driver stage and an output stage. These stages are generally the same as in the first embodiment except that the input stage is coupled to the command signal source by way of the inverting amplifier 50, which acts as a line driver, instead of by a capacitor, and the output stage comprises only one VMOS transistor instead of two parallel transistors.

Figure 4A:
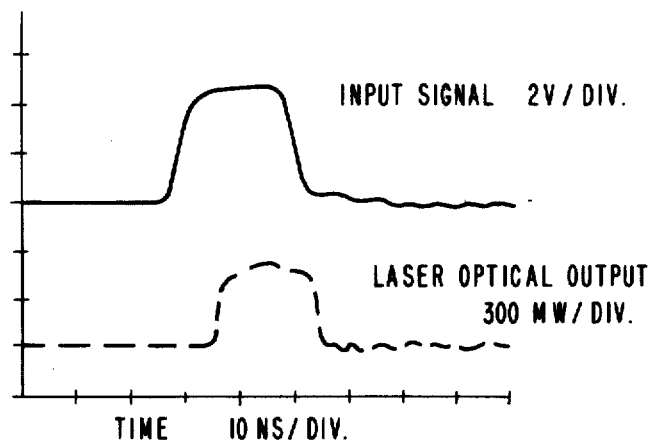
FIG. 4 illustrates test data on the circuit of FIG. 3.
Figure 4B:
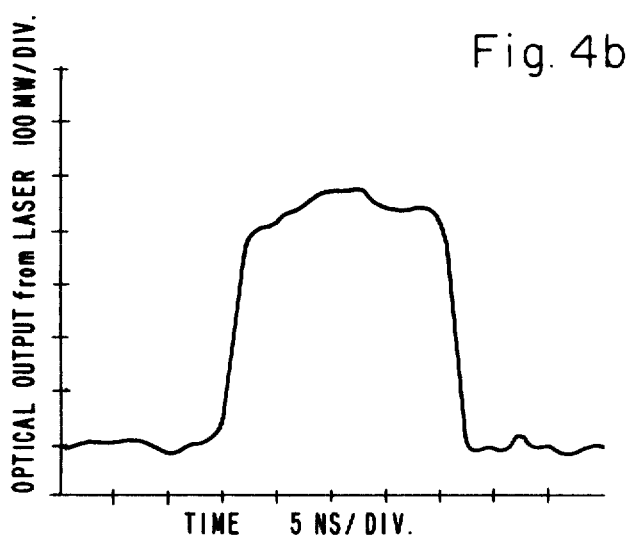

In addition, the operation of the embodiment of FIG. 3 is substantially the same as that of FIG. 1, as is shown by the graphs presented in FIG. 4. FIG. 4 shows various waveforms associated with the performance of the drive circuit of FIG. 3, and are similar to the graphs described with reference to FIG. 2. FIG. 4a shows the command signal (solid curve) applied to the input of the amplifier 50 along with the corresponding laser output pulse provided by the laser source. FIG. 4b shows an enlarged view of a typical laser output pulse provided by the circuit of FIG. 3. The rise and decay times associated with this pulse are on the order of 2.5 nanoseconds. The pulsewidth of the laser output pulse is about 22 nanoseconds and the peak output power is about 500 milliwatts.

Appendix A also presents a parts listing of the circuit described with reference to FIG. 3.

Thus, there has been described new and improved laser drive circuits which provide moderate or high-power, short-pulsewidth current pulses to a laser source. The shape of this high-power signal may be controlled by the choice of the command signal utilized to generate the drive signal.

It is to be understood that the above-described embodiments are merely illustrative of two of the many specific embodiments which represent applications of the principles of the present invention. Clearly, numerous and other varied arrangements may be readily devised by those skilled in the art without departing from the spirit and scope of the invention.

APPENDIX A

Presented hereinbelow is a parts list of the components utilized in the circuits of FIGS. 1 and 3.

| No. | Part | Part No./Value |
|---|---|---|
| | FIG. 1 | |
| 20 | Capacitor | 1.0 μF |
| 21 | Capacitor | 1.0 μF |
| 22 | Resistor | 1.5K ohm |
| 23 | Resistor | 13K ohm |
| 24 | VMOS Transistor | VN0104N3 |
| 25 | Resistor | 100 ohm |
| 30 | Capacitor | 0.01 μF |
| 31 | Resistor | 51 ohm |
| 32 | VMOS Transistor | VP0104N3 |
| 33 | VMOS Transistor | VN0104N3 |
| 34 | Capacitor | 0.1 μF |
| 38 | VMOS Transistor | VN1209S2 |
| 39 | VMOS Transistor | VN1209S2 |
| 40 | Resistor | 10-22 ohm |
| 41 | Resistor | 22 ohm |
| 42 | Diode | 1N5804 |
| 43 | Laser Diode Array | Laser Diode Labs, 9 chip array |
| | FIG. 3 | |
| 50 | NOR gate | 74128 |
| 53 | VMOS Transistor | VN0104N3 |
| 54 | Resistor | 51 ohm |
| 55 | Capacitor | 1000 pF |
| 56 | Resistor | 100 ohm |
| 57 | VMOS Transistor | VN0104N3 |
| 58 | VMOS Transistor | VP0104N3 |
| 59 | VMOS Transistor | VN0104N3 |
| 60 | Laser Diode | Hitachi HLMP-3400 |
| 61 | Diode | 1N5804 |
| 62 | Capacitor | 0.01 μF |
| 64 | Capacitor | 0.01 μF |

What is claimed is:

1. Circuitry for producing a high-current, short-pulsewidth drive signal to a laser source in response to a low-voltage, short-pulsewidth command signal, said circuitry comprising:

a VMOS amplifier stage comprising a VMOS transistor which amplifies the voltage level of said command signal to a predetermined voltage level;

a complementary driver stage coupled to said amplifier stage comprising a plurality of VMOS transistors arranged in a push-pull manner for providing a high-current capacity output signal in response to said amplified command signal; and an output stage coupled to said driver stage and to said laser source for receiving and amplifying said high-current capacity output signal in order to apply an amplified output signal to said laser source as the drive signal of said laser source, said drive signal being a high-power, short-pulsewidth signal, the duration of said drive signal being determined by said command signal.

2. A laser drive circuit for rapidly turning on and off drive current to a laser source with a low-voltage command signal, said circuit comprising:
- a first stage comprising a VMOS transistor which amplifies the voltage level of said low-voltage command signal to a predetermined level;
- a complementary driver stage comprising a plurality of VMOS transistors arranged in a push-pull manner for providing a high-current capacity output signal in response to said amplified command signal; and
- an output stage coupled to said driver stage and to said laser source for receiving and amplifying said high-current capacity output signal in order to apply a high-current amplified output signal to said laser source, said high-current output signal having a short pulsewidth determined by said command signal, said laser source being turned on and off in a rapid fashion by said circuit on command from said command signal.

3. The circuitry of claims 1 or 2 wherein said output stage comprises a plurality of VMOS transistors arranged in a parallel configuration.

4. The circuitry of claims 1 or 2 wherein said output stage comprises at least one VMOS transistor.

5. Circuitry for producing a high-current, short-pulsewidth drive signal to a laser source in response to a low-voltage, short-pulsewidth command signal, said circuitry comprising:
- a VMOS amplifier stage comprising a VMOS transistor which amplifies the voltage level of said command signal to a predetermined voltage level;
- a complementary driver stage coupled to said amplifier stage comprising a plurality of VMOS transistors arranged in a push-pull manner for providing a high-current capacity output signal in response to said amplified command signal;
- an output stage comprising at least one VMOS transistor coupled to said driver stage and to said laser source for receiving and amplifying said high-current capacity output signal in order to apply an amplified output signal to said laser source as the drive signal of said laser source, said drive signal being a high-current, short-pulsewidth signal, the duration of said drive signal being determined by said command signal.

6. A laser drive circuit for rapidly turning on and off drive current to a laser source with a low-voltage command signal, said circuit comprising:
- a first stage comprising a VMOS transistor which amplifies the voltage level of said low-voltage command signal to a predetermined level;
- a complementary driver stage comprising a plurality of VMOS transistors arranged in a push-pull manner for providing a high-current capacity output signal in response to said amplified command signal; and
- an output stage comprising at least one VMOS transistor coupled to said driver stage and to said laser source for receiving and amplifying said high-current capacity output signal in order to apply a high-current amplified output signal to said laser source, said high-current output signal having a short pulsewidth determined by said command signal, said laser source being turned on and off in a rapid fashion by said circuit on command from said command signal.

7. Circuitry for producing a short-pulsewidth drive signal to a laser source in response to a low-voltage, short-pulsewidth command signal, said circuitry comprising:
- a VMOS amplifier stage comprising a VMOS transistor which amplifies the voltage level of said command signal to a predetermined voltage level;
- a complementary driver stage coupled to said amplifier stage comprising a plurality of VMOS transistors arranged in a push-pull manner for providing a high-current capacity output signal in response to said amplified command signal; and
- an output stage comprising a plurality of VMOS transistors arranged in a parallel configuration coupled to said driver stage and to said laser source for receiving and amplifying said high-current capacity output signal in order to apply an amplified output signal to said laser source as the drive signal of said laser source, said drive signal being a high-power, short-pulsewidth signal, the duration of said drive signal being determined by said command signal.

8. A laser drive circuit for rapidly turning on and off drive current to a laser source with a low-voltage command signal, said circuit comprising:
- a first stage comprising a VMOS transistor which amplifies voltage level of said low-voltage command signal to a predetermined level;
- a complementary driver stage comprising a plurality of VMOS transistors arranged in a push-pull manner for providing a high-current capacity output signal in response to said amplified command signal; and
- an output stage comprising a plurality of VMOS transistors coupled to said driver stage and to said laser source for receiving and amplifying said high-current capacity output signal in order to apply a high current amplified output signal to said laser source, said high-current output signal having a short pulsewidth determined by said command signal, said laser source being turned on and off in a rapid fashion by said circuit on command from said command signal.

* * * * *